(12) United States Patent
Lin

(10) Patent No.: US 12,107,547 B2
(45) Date of Patent: Oct. 1, 2024

(54) SINGLE SIDEBAND MIXER

(71) Applicant: Realtek Semiconductor Corp., Hsinchu (TW)

(72) Inventor: Chia-Liang (Leon) Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 17/816,106

(22) Filed: Jul. 29, 2022

(65) Prior Publication Data

US 2024/0039476 A1  Feb. 1, 2024

(51) Int. Cl.
*H03D 7/16* (2006.01)
*H03D 7/14* (2006.01)

(52) U.S. Cl.
CPC .......... *H03D 7/165* (2013.01); *H03D 7/1441* (2013.01); *H03D 7/1483* (2013.01)

(58) Field of Classification Search
CPC ...... H03D 7/00; H03D 7/1475; H03D 7/1441; H03D 7/1425; H03D 7/14; H03D 7/1458
See application file for complete search history.

(56) References Cited

U.S. PATENT DOCUMENTS

| | | |
|---|---|---|
| 10,250,189 B1 | 4/2019 | Lin |
| 11,296,684 B2 * | 4/2022 | Lu .......................... H03K 5/135 |

* cited by examiner

*Primary Examiner* — Diana J. Cheng
(74) *Attorney, Agent, or Firm* — McClure, Qualey & Rodack, LLP

(57) ABSTRACT

A SSB (single sideband) mixer is configured to mix a first signal with a second signal, both the first signal and the second signal being a four-phase signal, and comprises eight gated inverters, each receiving a respective phase of the first signal and conditionally outputting a respective current in accordance with a control of a respective phase of the second signal, wherein currents output from the eight gated inverters are summed to establish a third signal that is a two-phase signal.

10 Claims, 4 Drawing Sheets

SINGLE SIDEBAND MIXER

BACKGROUND OF THE DISCLOSURE

Field of the Disclosure

The present disclosure generally relates to single sideband mixers, and particularly to single sideband mixers suitable for low-complexity interface and low-voltage application.

Description of Related Art

As is known, a single sideband (hereafter SSB) mixer receives a first signal of a first frequency and a second signal of a second frequency and outputs a third signal of a third frequency that is a sum of the first frequency and the second frequency. In a differential signaling embodiment, both the first signal and the second signal are four-phase signals, while the third signal is a two-phase signal. A schematic diagram of a prior art SSB mixer 100 is depicted in FIG. 1. SSB mixer 100 receives a first signal X and a second signal Y and outputs a third signal Z, wherein: the first signal X is a four-phase signal comprising a first phase $X_1$, a second phase $X_2$, a third phase $X_3$, and a fourth phase $X_4$; the second signal Y is a four-phase signal comprising a first phase $Y_1$, a second phase $Y_2$, a third phase $Y_3$, and a fourth phase $Y_4$; and the third signal Z is a two-phase signal comprising a first phase $Z_1$ a second phase Z 2. SSB 100 comprises a first Gilbert cell mixer 110, a second Gilbert cell mixer 120, and a load 130, wherein: the first Gilbert cell mixer 110 comprises six NMOS (n-channel metal oxide semiconductor) transistors 111, 112, 113, 114, 115, and 116 and is configured to mix $X_1$ and $X_3$ with $Y_1$ and $Y_3$, resulting in a first current pair $I_1$ and $I_2$; the second Gilbert cell mixer 120 comprises six NMOS transistors 121, 122, 123, 124, 125, and 126 and is configured to mix $X_2$ and $X_4$ with $Y_2$ and $Y_4$ resulting in a second current pair $I_3$ and $I_4$; the load 130 comprises a first inductor 131, a second inductor 132, and a capacitor 133.

Throughout this disclosure, "$V_{DD}$" denotes a power supply node, and "$V_{SS}$" denotes a ground node. The first signal X is of a first frequency $f_1$, and the second signal Y is of a second frequency $f_2$. $I_1$ and $I_4$ are summed at a first node 101, resulting in $Z_1$; $I_2$ and $I_3$ are summed at a second node 102, resulting in $Z_2$. The load 130 forms a resonant tank of a resonant frequency approximately equal to $f_1+f_2$, so that a dominant component of the third signal Z is of the frequency $f_1+f_2$. Gilbert cell mixers are well known in the prior art, so is SSB mixer 100; therefore, there is no need to describe them in detail here.

It is highly desirable that a preceding circuit (which is usually a buffer) that generates the first signal X and the second signal Y and a subsequent circuit (which is also usually a buffer) that receives the third signal Z also operate at the same power domain, i.e., across $V_{DD}$ and $V_{SS}$, otherwise the complexity of the overall system may be high. A first issue of SSB mixer 100 is, a common-mode voltage of the third signal Z is equal to $V_{DD}$ and is most likely too high for the subsequent circuit and therefore AC (alternate current) coupling is needed to interface with the subsequent circuit. A second issue of SSB mixer 100 is, $Z_1$ and $Z_2$ can swing to a level that can damage NMOS transistors 113-116 and 123-126, therefore some protection circuits, e.g., cascode devices inserted between the load 130 and the two Gilbert cell mixers 110 and 120, are needed.

In U.S. Pat. No. 10,250,189, Lin discloses an SSB mixer that can use DC (direct current) coupling to interface with the subsequent circuit and do not need protection circuits. However, the SSB mixer disclosed therein utilizes a stack up of two NMOS transistors and two PMOS transistors between $V_{DD}$ (the power supply node) and $V_{SS}$ (the ground node) and is not suitable for a low voltage application wherein a voltage difference between $V_{DD}$ and $V_{SS}$ is small.

What is desired is an SSB mixer that can use DC (direct current) coupling to interface with the subsequent circuit and thus allow a low-complexity interface, without protection circuits, and suitable for a low voltage application.

BRIEF SUMMARY OF THIS DISCLOSURE

In an embodiment, a GI (gated inverter) is configured to receive a phase of a first signal via an input pin, receive a phase of a second signal via a control pin, receive a complementary phase of the second signal that is complementary to said phase of the second signal via a complementary control pin, and output a current to an output node via an output pin, wherein the GI comprises: a first NMOST (n-channel metal oxide semiconductor transistor), of which a source, a gate, and a drain connect to a ground pin, the complementary control pin, and a first gate node, respectively; a first PMOST (p-channel metal oxide semiconductor transistor), of which a source, a gate, and a drain connect to the input pin, the complementary control pin, and the first gate node, respectively; a second NMOST, of which a source, a gate, and a drain connect to the input pin, the control pin, and a second gate node, respectively; a second PMOST, of which a source, a gate, and a drain connect to a power pin, the control pin, and the second gate node, respectively; a third NMOST, of which a source, a gate, and a drain connect to the ground pin, the first gate node, and the output pin, respectively; and a third PMOST, of which a source, a gate, and a drain connect to the power pin, the second gate node, and the output pin, respectively.

In an embodiment, a SSB (single sideband) mixer is configured to mix a first signal with a second signal, both the first signal and the second signal being a four-phase signal, and comprises: a first GI (gated inverter) configured to receive a first phase of the first signal and conditionally output a first current to a first node when a first phase of the second signal is asserted; a second GI configured to receive a third phase of the first signal and conditionally output a second current to the first node when a third phase of the second signal is asserted; a third GI configured to receive a second phase of the first signal and conditionally output a third current to the first node when a fourth phase of the second signal is asserted; a fourth GI configured to receive a fourth phase of the first signal and conditionally output a fourth current to the first node when a second phase of the second signal is asserted; a fifth GI configured to receive the first phase of the first signal and conditionally output a fifth current to a second node when the third phase of the second signal is asserted; a sixth GI configured to receive the third phase of the first signal and conditionally output a sixth current to the second node when the first phase of the second signal is asserted; a seventh GI configured to receive the second phase of the first signal and conditionally output a seventh current to the second node when the second phase of the second signal is asserted; and an eighth GI configured to receive the fourth phase of the first signal and conditionally output an eighth current to the second node when the fourth phase of the second signal is asserted.

DETAILED DESCRIPTION OF THIS DISCLOSURE

Figure 1:
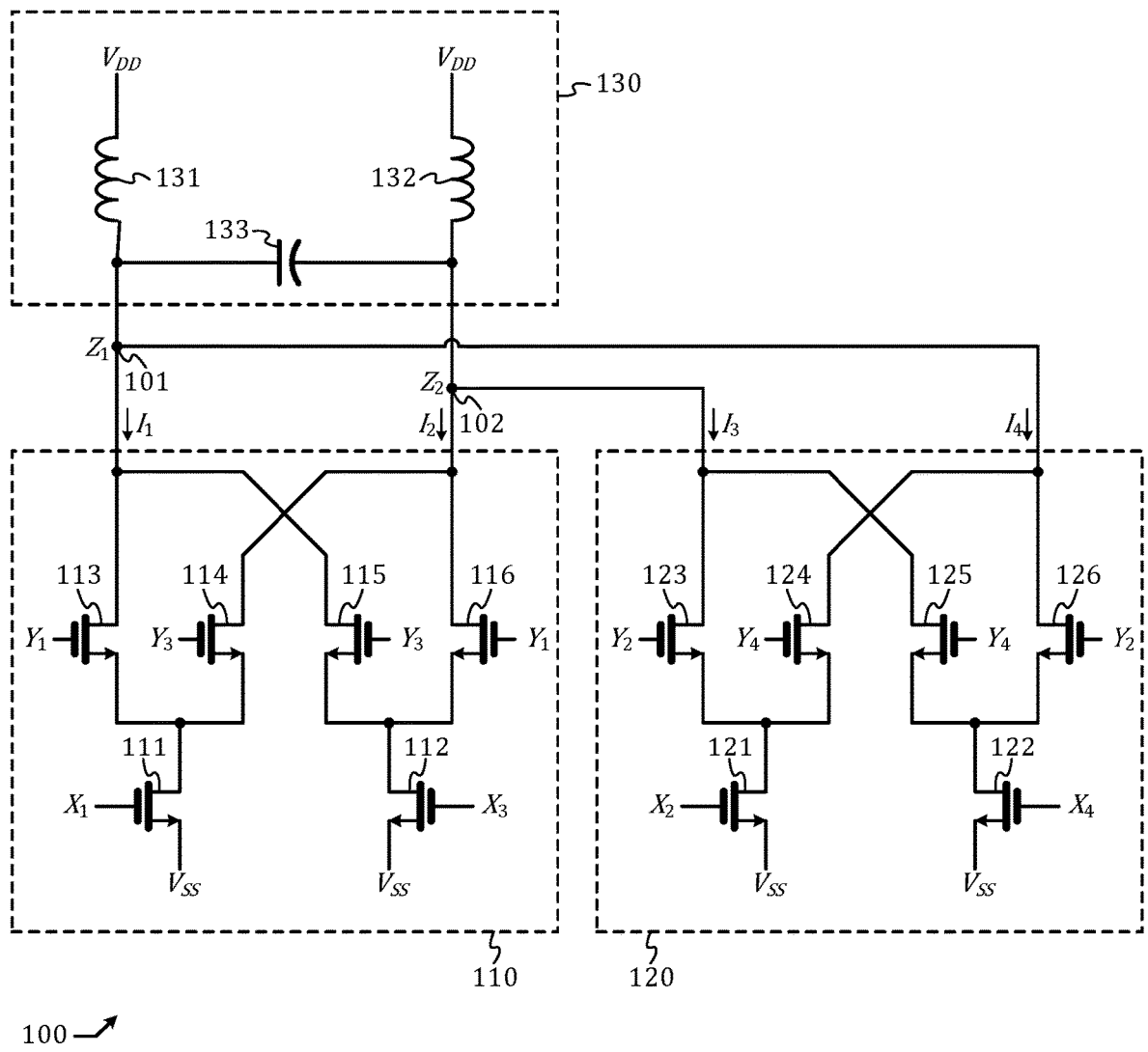
FIG. 1 shows a schematic diagram of a prior art SSB (single sideband mixer) mixer.

The present disclosure relates to single sideband mixers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "circuit," "load," "voltage," "current," "signal," "inductor," "capacitor," "LC tank," "inverter," "transistor," "MOS (metal-oxide semiconductor)," "PMOS (p-channel metal oxide semiconductor)," "NMOS (n-channel metal oxide semiconductor)," "CMOS (complementary metal oxide semiconductor)," "node," "power supply," "ground," "source," "gate," "drain," "ground node," "power supply node," "frequency," "single sideband," "mixer," "resonant tank," and "impedance."

Those of ordinary skill in the art can read schematics of a circuit comprising electronic components such as inductors, capacitors, resistors, NMOS transistors, PMOS transistors, switches, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of components such as transistors, capacitors, resistors, and/or other electronic devices interconnected in a certain manner to embody a certain function. A network is a circuit or a collection of circuits.

A signal is either a voltage or a current of a variable level that carries a certain information and can vary with time; when the signal is a voltage, it is said to be a "voltage signal"; when the signal is a current, it is said to be a "current signal." A level of the voltage or the current of the signal at a moment represents a state of the signal at that moment. In this disclosure, a signal is by default a voltage signal, unless otherwise specified. In other words, a "voltage signal" can be simply stated as a "signal" for brevity.

A logical signal is a voltage signal of two states: a low state and a high state, with respect to an associated trip point. Regarding a logical signal Q, "Q is high" or "Q is low," means that "Q is in the high state" (i.e., above the associated trip point) or "Q is in the low state" (i.e., below the associated trip point).

A logical signal is often used as a control signal to turn on or turn off a function of a circuit. When the logical signal is in a logical state that turns on the function of the circuit, the logical signal is said to be "asserted"; otherwise, the logical signal is said to be "de-asserted." If a logical signal is "asserted" when it is high, it is said to be "active high"; if a logical signal is "asserted" when it is low, it is said to be "active low." An "active high" logical signal is asserted when it is above a trip point, and de-asserted when it is below the trip point.

A first logical signal is said to be a logical inversion of a second logical signal if the first logical signal and the second logical signal always have opposite states. That is, when the first logical signal is high, the second logical signal will be low; when the first logical signal is low, the second logical signal will be high. When a first logical signal is a logical inversion of a second logical signal, the first logical signal is said to be complementary to the second logical signal.

Throughout this disclosure, "$V_{DD}$" denotes a power supply node, and "$V_{SS}$" denotes a ground node.

A four-phase signal is a periodic signal comprising four phases including a first phase, a second phase, a third phase, and a fourth phase that are evenly spaced in order in time. In a particular case of interest wherein the four-phase signal is a logical signal of either a sinusoidal or a square waveform, the third (first) phase is complementary to the first (third) phase, while the fourth (second) phase is complementary to the second (fourth) phase. Therefore, the third (first) phase can be said to be a complementary phase of the first (third) phase, while the fourth (second) phase can be said to be a complementary phase of the second (fourth) phase.

A two-phase signal is a periodic signal comprising two phases including a first phase and a second phase. In a particular case of interest wherein the two-phase signal is a logical signal of either a sinusoidal or a square waveform, the second (first) phase is complementary to the first (second) phase.

Figure 2A:
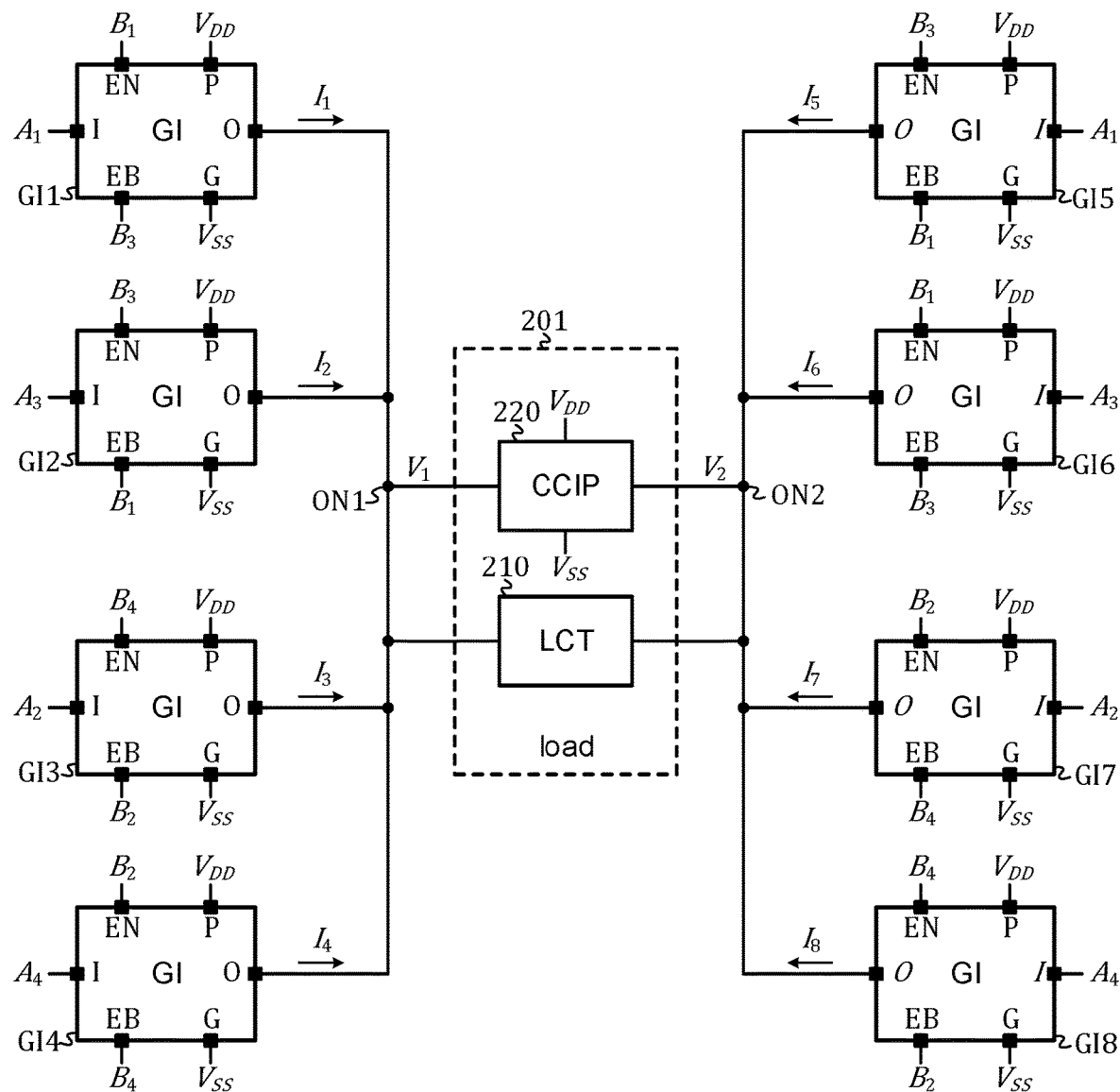
FIG. 2A shows a schematic diagram of a SSB mixer in accordance with an embodiment of the present disclosure.

A schematic diagram of a single sideband (SSB) mixer 200 in accordance with an embodiment of the present disclosure is depicted in FIG. 2A. SSB mixer 200 receives a first signal A and a second signal B and output a third signal $V_O$, wherein: the first signal A is a four-phase signal comprising a first phase $A_1$, a second phase $A_2$, a third phase $A_3$, and a fourth phase $A_4$; the second signal B is a four-phase signal comprising a first phase $B_1$, a second phase $B_2$, a third phase $B_3$, and a fourth phase $B_4$; and the third signal $V_O$ is a two-phase signal comprising a first phase $V_1$ that is a voltage at a first output node ON1 and a second phase $V_2$ that is a voltage at a second output node ON2. SSB mixer 200 comprises eight gated inverters (GI) including gated inverter GI1, GI2, GI3, GI4, GI5, GI6, GI7, and GI8, wherein all the eight gated inverters are instantiated from the same circuit that has an input pin labeled by "I," an output pin labeled by "0," a control pin labeled by "EN," a complementary control pin labeled by "EB," a power pin labeled by "P," and a ground pin labeled by "G." Gated inverter GI1 (GI2, GI3, GI4, GI5, GI6, GI7, GI8) is configured to receive $A_1$ ($A_3$, $A_2$, $A_4$, $A_1$, $A_3$, $A_2$, $A_4$) via its input pin "I" and output a first (second, third, fourth, fifth, sixth, seventh, eighth) current $I_1$ ($I_2$, $I_3$, $I_4$, $I_5$, $I_6$, $I_7$, $I_8$) via its output pin "O" to ON1 (ON1, ON1, ON1, ON2, ON2, ON2, ON2) in accordance with a control by $B_1$ ($B_3$, $B_4$, $B_2$, $B_3$, $B_1$, $B_2$, $B_4$) received via its control pin "EN" and its complement $B_3$ ($B_1$, $B_2$, $B_4$, $B_1$, $B_3$, $B_4$, $B_2$) received via its complementary control pin "EB." In an embodiment, SSB mixer 200 further comprises a load 201 comprising a LC tank (LCT, wherein L stands for inductor and C stands for capacitor) 210 inserted across ON1 and ON2. In an embodiment, the load 201 further comprise a cross-coupling inverter pair (CCIP) 220 inserted across ON1 and ON2.

In an embodiment, each of $A_i$ and $B_i$ (for i=1,2,3,4) is a logical signal that is in a high state when it is above a trip point $V_{tp}$ and in a low state when it is below the trip point $V_{tp}$.

In an embodiment, the first signal A is a four-phase sinusoidal signal of a first frequency $f_1$ and the second signal B is a four-phase sinusoidal signal of a second frequency $f_2$, and they can be mathematically modeled by the following two equations:

$$A_i = V_{tp} + V_{AA}\cos\left(2\pi f_1 t + \frac{(i-1)\pi}{2}\right) \text{ for } i = 1, 2, 3, 4 \quad (1)$$

$$B_i = V_{tp} + V_{AB}\cos\left(2\pi f_2 t + \frac{(i-1)\pi}{2}\right) \text{ for } i = 1, 2, 3, 4 \quad (2)$$

Here, t denotes a time variable, $V_{AA}$ is an amplitude of the first signal A, and $V_{AB}$ is an amplitude of the second signal B.

In an alternative embodiment, the first signal A is a four-phase square-wave signal of a first frequency $f_1$ and the second signal B is a four-phase square-wave signal of a second frequency $f_2$, and they can be mathematically modeled by the following two equations:

$$A_i = V_{tp} + V_{AA}\cdot\text{sign}\left(\cos\left(2\pi f_1 t + \frac{(i-1)\pi}{2}\right)\right) \text{ for } i = 1, 2, 3, 4 \quad (3)$$

$$B_i = V_{tp} + V_{AB}\cdot\text{sign}\left(\cos\left(2\pi f_2 t + \frac{(i-1)\pi}{2}\right)\right) \text{ for } i = 1, 2, 3, 4 \quad (4)$$

Here, sign(•) denotes a sign function that outputs 1 when its argument is positive and outputs −1 when its argument is negative.

Figure 2B:
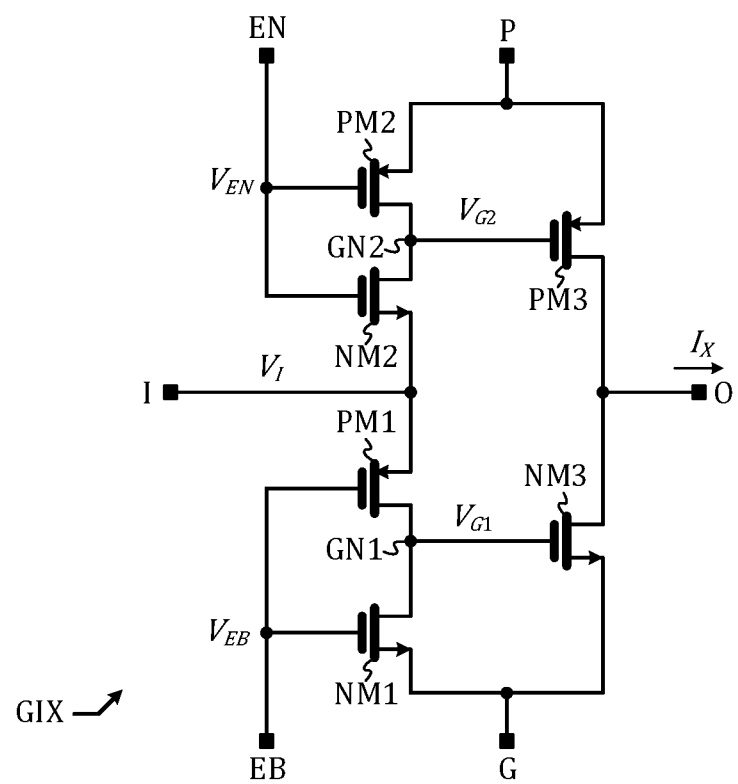
FIG. 2B shows a schematic diagram of a gated inverter that can be instantiated and used in the SSB mixer of FIG. 2A in accordance with an embodiment of the present disclosure.

A schematic diagram of a gated inverter GIX that can be instantiated to embody the eight gated inverters GI1-GI8 is shown in FIG. 2B. As mentioned earlier, GIX has an input pin "I," an output pin "O," a power pin "P," a ground pin "G," a control pin "EN," and a complementary control pin "EB." Gated inverter GIX comprises three NMOS transistors NM1, NM2, and NM3, and three PMOS transistors PM1, PM2, and PM3. The source, the gate, and the drain of NMOS transistor NM1 connect to pin "G," pin "EB," and a first gate node GN1, respectively. The source, the gate, and the drain of PMOS transistor PM1 connect to pin "I," pin "EB," and the first gate node GN1, respectively. The source, the gate, and the drain of NMOS transistor NM2 connect to pin "I," pin "EN," and a second gate node GN2, respectively. The source, the gate, and the drain of PMOS transistor PM2 connect to pin "P," pin "EN" and the second gate node GN2, respectively. The source, the gate, and the drain of NMOS transistor NM3 connect to pin "G," the first gate node GN1, and pin "O," respectively. The source, the gate, and the drain of PMOS transistor PM3 connect to pin "P," the second gate node GN2, and pin "O," respectively.

Gated inverter GIX receives an input voltage $V_I$ at the input pin "I" and output a current $I_X$ via the output pin "O" in accordance with a control voltage $V_{EN}$ at the control pin "EN" along with a complementary control voltage $V_{EB}$ at the complementary control pin "EB." The power pin "P" connects to a power supply node (i.e., "$V_{DD}$" of FIG. 2A) of a high voltage, while the ground pin "G" connects to a ground node (i.e., "$V_{SS}$" of FIG. 2A) of a low voltage. When $V_{EN}$ is high (i.e., asserted in an active high scenario) and $V_{EB}$ is low (i.e., asserted in an active low scenario), NM1 is turned off, PM1 is turned on, NM2 is turned on, and PM2 is turned off; in this case, both a first gate voltage $V_{G1}$ at the first gate node GN1 and a second gate voltage $V_{G2}$ at the second gate node will be pulled toward $V_I$, and the gated inverter GIX is effectively an inverter comprising NMOS transistor NM3 and PMOS transistor PM3 and configured to receive the input voltage $V_I$ and output the output current $I_X$, wherein $I_X$ is negative when $V_I$ is high and positive when $V_I$ is low and thus an inversion function is fulfilled. When $V_{EN}$ is low (i.e., de-asserted in an active high scenario) and $V_{EB}$ is high (i.e., de-asserted in an active low scenario), NM1 is turned on, PM1 is turned off, NM2 is turned off, and PM2 is turned on; in this case, $V_{G1}$ is pulled low while $V_{G2}$ is pulled high, and NMOS transistor NM3 and PMOS transistor PM3 are both turned off, and the output current $I_X$ is zero. In summary, a function of the gated inverter GIX can be described by the following table:

| | $V_{EN}$ is high and $V_{EB}$ is low | $V_{EN}$ is low and $V_{EB}$ is high |
|---|---|---|
| $V_I$ is high | $I_X < 0$ | $I_X = 0$ |
| $V_I$ is low | $I_X > 0$ | $I_X = 0$ |

Those of ordinary skill in the art can recognize that the gated inverter GIX embodies a mixing function that resembles what a Gilbert cell mixer does as disclosed in U.S. Pat. No. 10,250,189. The difference, however, is that the Gilbert cell mixer disclosed in U.S. Pat. No. 10,250,189 comprises two NMOS transistors and two PMOS transistors stacked up between a power supply node and a ground node, while the gated inverter GIX only has one NMOS transistor (i.e., NM3) and one PMOS transistor (i.3., PM3) stacked up between the power supply node (connected to the power pin "P") and the ground node (connected to the ground pin "G"). The gated inverter GIX thus has a wider available voltage headroom due to less number of transistor stack-up and thus can work in a lower supply voltage application. Although GIX also has four transistors NM1, PM1, NM2, and PM2 stacked up, it occurs on the input side, which has a more relaxed requirement on the voltage headroom, because an inverter has an amplification function.

Let an impedance of the load 201, i.e., an impedance between ON1 and ON2, be Z L. The third signal $V_O$ is defined as a difference between its first phase $V_1$ and its second phase $V_2$ and can be mathematically modeled by the following equation:

$$V_O = V_1 - V_2 = (I_1 + I_2 + I_3 + I_4 - I_5 - I_6 - I_7 - I_8)\cdot Z_L \quad (5)$$

Gated inverter GI1 (GI2, GI3, GI4, GI5, GI6, GI7, GI8) outputs $I_1$ ($I_2$, $I_3$, $I_4$, $I_5$, $I_6$, $I_7$, $I_8$) that represents a mixing of $A_1$ ($A_3$, $A_2$, $A_4$, $A_1$, $A_3$, $A_2$, $A_4$) and $B_1$ ($B_3$, $B_4$, $B_2$, $B_3$, $B_1$, $B_2$, $B_4$), which can be mathematically modeled as a multiplication of $\cos(2\pi f_1 t)$ ($-\cos(2\pi f_1 t)$, $-\sin(2\pi f_1 t)$, $\sin(2\pi f_1 t)$, $\cos(2\pi f_1 t)$, $-\cos(2\pi f_1 t)$, $-\sin(2\pi f_1 t)$, $\sin(2\pi f_1 t)$) with $\cos(2\pi f_2 t)$ ($-\cos(2\pi f_2 t)$, $\sin(2\pi f_2 t)$, $-\sin(2\pi f_2 t)$, $-\cos(2\pi f_2 t)$, $\cos(2\pi f_2 t)$, $-\sin(2\pi f_2 t)$, $\sin(2\pi f_2 t)$). By using equation (5), we find that $V_O$ will be approximately proportional to $\cos(2\pi f_1 t) \cos(2\pi f_2 t) - \sin(2\pi f_1 t) \sin(2\pi f_2 t)$, i.e., $$V_O \propto \cos(2\pi f_1 t)\cos(2\pi f_2 t) - \sin(2\pi f_1 t) - \sin(2\pi f_2 t) = \cos(2\pi(f_1+f_2)t) \quad (6)$$

In other words, a frequency of the third signal $V_O$ is equal to a sum of $f_1$ (which is the frequency of the first signal A) and $f_2$ (which is the frequency of the second signal B).

Figure 2C:
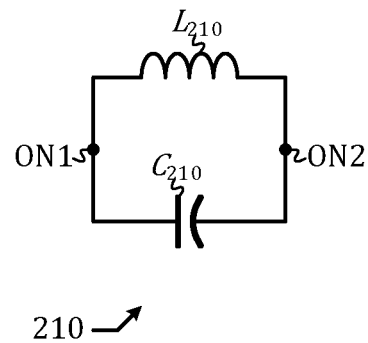
FIG. 2C shows a schematic diagram of a LC tank used in the SSB mixer of FIG. 2A.

LCT 210 is configured to form a resonance and thus provide a high impedance between ON1 and ON2 at the desired frequency of $V_O$, which is $f_1+f_2$. As shown in FIG. 2C, LCT 210 comprises a parallel connection of an inductor $L_{210}$ and a capacitor $C_{210}$. The resonance condition can be described by the following equation:

$$f_1 + f_2 \cong \frac{1}{2\pi\sqrt{L_{210}C_{210}}} \quad (7)$$

Figure 2D:
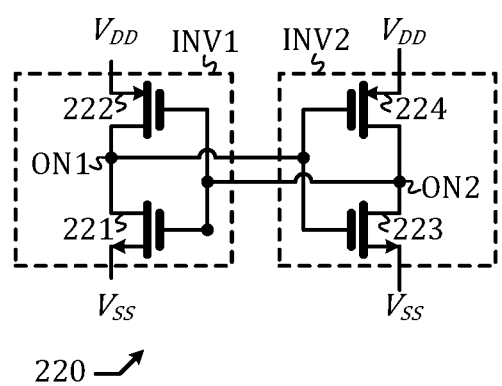
FIG. 2D shows a schematic diagram of a cross-coupling inverter pair used in the SSB mixer of FIG. 2D.

As shown in FIG. 2D, CCIP 220 comprises a first inverter INV1 comprising NMOS transistor 221 and PMOS transistor 222, and a second inverter INV2 comprising NMOS transistor 223 and PMOS transistor 224; the two inverters INV1 and INV2 are configured in a cross-coupled topology, wherein an output of the first inverter INV1 at ON1 is an input of the second inverter INV2 and an output of the second inverter INV2 at ON2 is an input of the first inverter INV1. CCIP 220 is used to fulfill two purposes: first, providing a gain enhancement, and second, establishing a common-mode level for the third signal $V_O$ (which is a two-phase signal comprising $V_1$ and $V_2$). CCIP 220 can provide positive feedback between ON1 and ON2 and thus effectively enlarge the impedance between ON1 and ON2 and thus enhance a gain factor for the third signal $V_O$. A common-mode level of a CCIP 220 is equal to a trip point of the two inverters INV1 and INV2, which effectively defines the common-mode level of $V_O$.

Now refer to FIG. 2B. Note that, the control signal $V_{EN}$ received via the "EN" pin controls the gate of NM2 and the complementary control signal $V_{EB}$ received via the "EB" pin controls the gate of PM1. In contrast, the input signal $V_I$ received via the "I" pin flows through the source of NM2 and the source of PM1. For a transistor, a gate node is a higher impedance node, while a source node is a lower impedance node, and it is more difficult for a preceding circuit to drive the source than drive the gate. It is preferable to let a higher frequency signal connect to a gate of a transistor and a lower frequency signal connect to a source of the transistor than the other way around, because a higher frequency signal is inherently more difficult for a preceding circuit to drive and therefore it is better to let the higher frequency signal connect to a higher impedance node to ease the burden of the preceding circuit. Therefore, in a preferred embodiment that allows each of the eight gated inverters GI1-GI8 to have a better mixing efficiency, the frequency of the control signal (received via its control pin "EN" and complementary control pin "EB") is higher than the frequency of the input signal (received via its input pin "I"). In other words, the frequency of the second signal B is higher than the frequency of the first signal A. If the frequency of the second signal B is lower than the frequency of the first signal A, the two signals can be swapped, so that the function remains the same, but the mixing efficiency can be higher.

By way of example but not limitation: SSB mixer 200 is fabricated using a 28 nm CMOS process; $V_{DD}$ is 1V; $V_{SS}$ is 0V; $f_1$ is 4 GHz; $f_2$ is 8 GHz; $V_{tp}$ is 0.5V; $V_{AA}$ is 0.5V; $V_{AB}$ is 0.5V; the width and length are 1.8 µm and 30 nm, respectively, for NMOS transistors NM1, NM2, and NM3; the width and length are 2.34 µm and 30 nm, respectively, for PMOS transistors PM1, PM2, and PM3; the width and length are 0.6 µm and 30 nm, respectively, for NMOS transistors 221 and 223; the width and length are 0.78 µm and 30 nm, respectively, for PMOS transistors 222 and 224; inductor $L_{210}$ is 1 nH; and capacitor $C_{210}$ is 164 fF. The common-mode voltage of the third signal $V_O$ is approximately 0.5V. Due to using the complementary topology, the common-mode voltage of the third signal $V_O$ is approximately at a midpoint between $V_{DD}$ and $V_{SS}$. SSB mixer 200 thus resolves the reliability issue and the common-mode issue of SSB mixer 100 of FIG. 1. In addition, SSB mixer 200 is more suitable in a low voltage application than the SSB mixer disclosed in U.S. Pat. No. 10,250,189, as explained earlier.

Now refer to FIG. 2A. In an alternative embodiment, not shown in figure but can be clearly understood by those of ordinary skill in the art, $B_2$ and $B_4$ are swapped, so that $I_3$ and $I_4$ are directed to ON2 (instead of ON1 as shown in FIG. 2A), while $I_7$ and $I_8$ are directed to ON1 (instead of ON2 as shown in FIG. 2A). In this alternative embodiment, $V_O$ will be approximately proportional to $\cos(2\pi f_1 t)\cos(2\pi f_2 t)+\sin(2\pi f_1 t)\sin(2\pi f_2 t)$, which is equal to $\cos(2\pi(f_1-f_2)t)$, and LCT 210 is configured to form a resonant network (across ON1 and ON2) that resonates at $|f_1-f_2|$, instead of $f_1+f_2$. In other words, the following condition must be met:

$$|f_1 - f_2| \cong \frac{1}{2\pi\sqrt{L_{210}C_{210}}} \quad (8)$$

In the appended claims, this alternative embodiment is not separately claimed, because what is claimed is still applicable, only that the four phases of the second signal B are reverse in order but remain evenly spaced in time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A SSB (single sideband) mixer configured to mix a first signal with a second signal, both the first signal and the second signal being a four-phase signal, and comprising:
   a first GI (gated inverter) configured to receive a first phase of the first signal and conditionally output a first current to a first node when a first phase of the second signal is asserted;
   a second GI configured to receive a third phase of the first signal and conditionally output a second current to the first node when a third phase of the second signal is asserted;
   a third GI configured to receive a second phase of the first signal and conditionally output a third current to the first node when a fourth phase of the second signal is asserted;
   a fourth GI configured to receive a fourth phase of the first signal and conditionally output a fourth current to the first node when a second phase of the second signal is asserted;

a fifth GI configured to receive the first phase of the first signal and conditionally output a fifth current to a second node when the third phase of the second signal is asserted;

a sixth GI configured to receive the third phase of the first signal and conditionally output a sixth current to the second node when the first phase of the second signal is asserted;

a seventh GI configured to receive the second phase of the first signal and conditionally output a seventh current to the second node when the second phase of the second signal is asserted; and an eighth GI configured to receive the fourth phase of the first signal and conditionally output an eighth current to the second node when the fourth phase of the second signal is asserted, wherein the GI circuit comprises: a first NMOST (n-channel metal oxide semiconductor transistor), of which a source, a gate, and a drain connect to the ground pin, the complementary control pin, and a first gate node, respectively; a first PMOST (p-channel metal oxide semiconductor transistor), of which a source, a gate, and a drain connect to the input pin, the complementary control pin, and the first gate node, respectively; a second NMOST, of which a source, a gate, and a drain connect to the input pin, the control pin, and a second gate node, respectively; a second PMOST, of which a source, a gate, and a drain connect to the power pin, the control pin, and the second gate node, respectively; a third NMOST, of which a source, a gate, and a drain connect to the ground pin, the first gate node, and the output pin, respectively; and a third PMOST, of which a source, a gate, and a drain connect to the power pin, the second gate node, and the output pin, respectively.

2. The SSB mixer of claim 1, wherein the first GI, the second GI, the third GI, the fourth GI, the fifth GI, the sixth GI, the seventh GI, and the eighth GI are all instantiated from a GI circuit that has an input pin, an output pin, a control pin, a complementary control pin, a power pin, and a ground pin, wherein a respective phase of the first signal is received via the input pin, a respective phase of the second signal is received via the control pin, a complementary phase of the second signal that is complementary to said respective phase of the second signal is received via the complementary control pin, and a respective output current is output via the output pin.

3. The SSB mixer of claim 1, wherein a frequency of the second signal is higher than a frequency of the first signal.

4. The SSB mixer of claim 1 further comprising a LC (inductor-capacitor) tank comprising a parallel connection of an inductor and a capacitor placed across the first node and the second node.

5. The SSB mixer of claim 4, wherein the LC tank is of a resonant frequency approximately equal to a sum of a frequency of the first signal and a frequency of the second signal.

6. The SSB mixer of claim 4, wherein the LC tank is of a resonant frequency approximately equal to a difference of a frequency of the first signal and a frequency of the second signal.

7. The SSB mixer of claim 1 further comprising a cross-coupling inverter pair comprising a first inverter and a second inverter, wherein an output of the first inverter at the first node is received by the second inverter and an output of the second inverter at the second node is received by the first inverter.

8. A GI (gated inverter) configured to receive a phase of a first signal via an input pin, receive a phase of a second signal via a control pin, receive a complementary phase of the second signal that is complementary to said phase of the second signal via a complementary control pin, and output a current to an output node via an output pin, wherein the GI comprises:

a first NMOST (n-channel metal oxide semiconductor transistor), of which a source, a gate, and a drain connect to a ground pin, the complementary control pin, and a first gate node, respectively;

a first PMOST (p-channel metal oxide semiconductor transistor), of which a source, a gate, and a drain connect to the input pin, the complementary control pin, and the first gate node, respectively;

a second NMOST, of which a source, a gate, and a drain connect to the input pin, the control pin, and a second gate node, respectively;

a second PMOST, of which a source, a gate, and a drain connect to a power pin, the control pin, and the second gate node, respectively;

a third NMOST, of which a source, a gate, and a drain connect to the ground pin, the first gate node, and the output pin, respectively; and a third PMOST, of which a source, a gate, and a drain connect to the power pin, the second gate node, and the output pin, respectively.

9. The GI of claim 8, wherein a frequency of the second signal is higher than a frequency of the first signal.

10. The GI of claim 8, wherein the second signal is a four-phase signal comprising a first phase, a second phase, a third phase, and a fourth phase that are evenly spaced in time, wherein the third phase is complementary to the first phase, and the fourth phase is complementary to the second phase.

* * * * *